United States Patent [19]

Hatta et al.

[11] Patent Number: 5,329,231
[45] Date of Patent: Jul. 12, 1994

[54] MAGNETIC RESONANCE IMAGING APPARATUS

[75] Inventors: Jun-ichi Hatta, Ootawara; Yoshio Machida, Tochigi, both of Japan

[73] Assignee: Kabushiki Kaisha Toshiba, Kanagawa, Japan

[21] Appl. No.: 48,462

[22] Filed: Apr. 14, 1993

[30] Foreign Application Priority Data

Apr. 14, 1992 [JP] Japan .................................. 4-094263

[51] Int. Cl.$^5$ .............................................. G01R 33/20
[52] U.S. Cl. ...................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,689,563 | 8/1987 | Bottomley et al. | 324/309 |
| 4,689,564 | 8/1987 | Leue et al. | 324/309 |
| 4,694,254 | 9/1987 | Vatis et al. | 324/309 |
| 4,786,872 | 11/1988 | Hoshino | 324/309 |
| 5,159,550 | 10/1992 | Sakamoto et al. | 324/307 |

OTHER PUBLICATIONS

"Scan Time Reduction in Snapshot Flash MRI," P. M. Jakob and A. Haase, Magnetic Resonance in Medicine, vol. 24, No. 2, pp. 391–396 (Apr. 1992).

"Snapshot FLASH MRI. Applications to T1, T2, and Chemical-Shift Imaging," A. Haase, Magnetic Resonance In Medicine, vol. 13, pp. 77–89 (1990).

*Primary Examiner*—Michael J. Tokar
*Attorney, Agent, or Firm*—Limbach & Limbach

[57] ABSTRACT

In a presaturation period, a radio-frequency (RF) pulse for selectively tilting only spins outside an imaging region is applied while a slice selective gradient field Gs is applied, and a spoiler gradient field Gsp for saturating transverse magnetization outside the imaging region is subsequently applied to selectively presaturate the spins outside the imaging region. In a high-speed imaging period after the presaturation period, a sequence TR constituted by an operation of applying a very short rectangular non-selective excitation pulse RF for tilting spins in a slice by a predetermined angle, an operation of applying phase encoding and readout gradient fields Gp and Gr (without applying the slice selective gradient field Gs), and an operation of acquiring an MR signal is performed many times while the amplitude of the phase encoding gradient field Gp is changed, thereby acquiring a one-slice MR signal. In some cases, an operation of applying the spoiler gradient field Gsp is added after the operation of acquiring an MR signal.

17 Claims, 7 Drawing Sheets

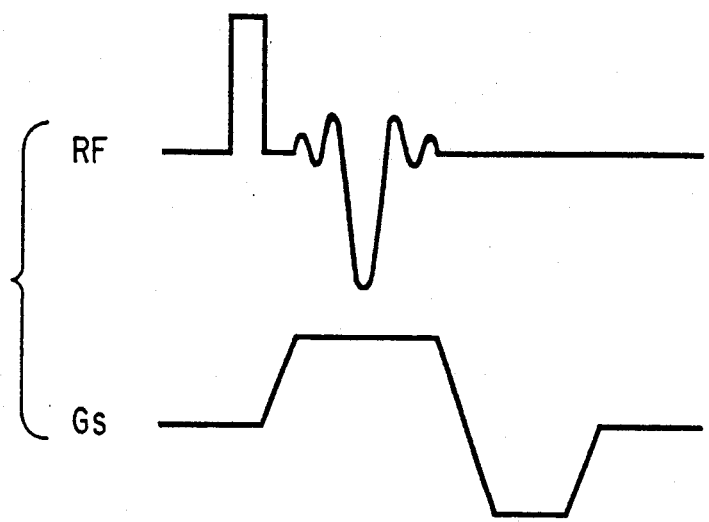
F I G. 5
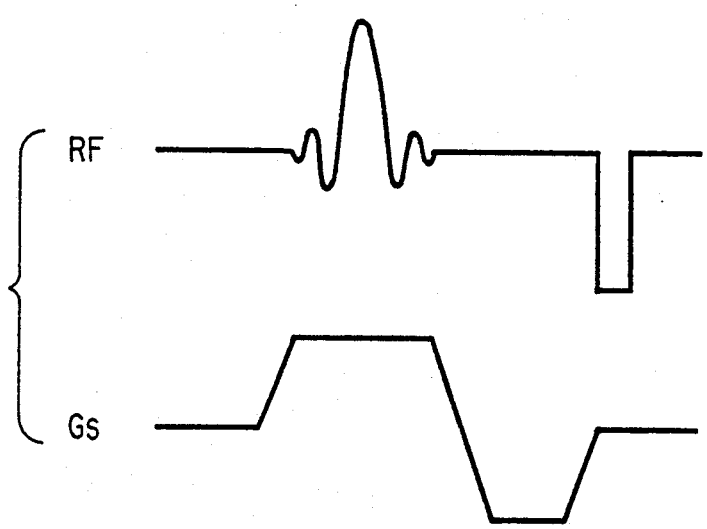
F I G. 6
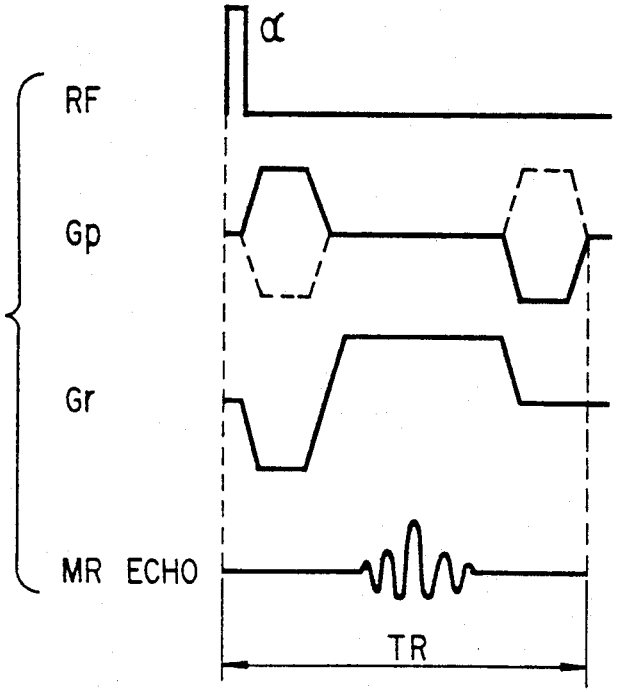
F I G. 7

MAGNETIC RESONANCE IMAGING APPARATUS

BACKGROUND OF THE INVENTION

1. Field of the Invention

The present invention relates to a magnetic resonance imaging apparatus for practicing a high-speed imaging method.

2. Description of the Related Art

A high-speed imaging method with a short repetition time TR, called a FLASH (fast low angle shot) method, is known. In this method, an MR echo signal is acquired by a field gradient method, and an RF pulse having a small flip angle $\alpha$ is used.

Although the contrast of the image can be changed to some degree by changing a flip angle $\alpha$ and the repetition time TR, it is difficult to obtain sufficient contrast.

Recently, therefore, high-speed imaging methods capable of changing the contrast more freely have been developed. One of such methods is disclosed in "Snapshot FLASH MRI. Applications to T1, T2, and Chemical-Shift Imaging", A. Haase, Magnetic Resonance in Medicine 13, pp. 77–89 (1990). In this snapshot FLASH method, the repetition time TR is extremely shortened (e.g., 3 ms), and the number of encoding steps (the number of pixels of an imaging matrix) in the phase encoding direction is reduced to 64, so that the time required for one imaging operation is set to be as short as 200 ms which is shorter than a spin-lattice relaxation time T1 of a tissue. This magnetic resonance imaging method is known to be capable of T1 enhancement, T2 (spin-spin relaxation time) enhancement, and chemical-shift-selective (CHESS) imaging as well as having a short imaging time.

In the snapshot FLASH method, however, the repetition time TR is set to be several ms which is extremely short as compared with general high-speed imaging, and a selective RF pulse and a slice selective gradient field are applied to perform selective excitation for each imaging operation. For this reason, a gradient field needs to rise and fall within a very short period of time, and the minimum repetition time TR (about 3 ms) is determined by the specifications of a gradient amplifier. The repetition time cannot be shorter than about 3 ms.

SUMMARY OF THE INVENTION

The present invention has been made in consideration of the above situation, and has an object to provide a magnetic resonance imaging apparatus which can execute high-speed imaging by shortening the repetition time without changing the specification of a gradient amplifier, and also can realize an improvement in image quality.

A magnetic resonance imaging apparatus according to the present invention comprises means for selectively presaturating spins outside an imaging region; and high-speed imaging means for acquiring an MR signal in the imaging region by using a non-selective excitation pulse, wherein the high-speed imaging means executes a pulse sequence in which an operation (1) of applying a non-selective excitation pulse, an operation (2) of applying a phase encoding gradient field, and an operation (3) of generating a magnetic resonance signal by inverting a readout gradient field are repeated while an amplitude of the phase encoding gradient field is changed.

According to the magnetic resonance imaging apparatus of the present invention, spins outside an imaging region are selectively saturated in a presaturation period prior to an imaging operation, and the imaging operation is completed in a period of time equal to or shorter than a spin-lattice relaxation time T1 of a tissue. Therefore, it is not necessary to apply a slice selective gradient field and a selective excitation RF pulse for every phase encoding step in an imaging period. That is, a short rectangular non-selective excitation RF pulse may be applied, and hence a repetition time TR can be shortened without changing the specification of a gradient amplifier.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 shows a first modification of the pulse sequence during the presaturation period in the first embodiment;

FIG. 6 shows a second modification of the pulse sequence during the presaturation period in the first embodiment;

FIG. 7 shows a pulse sequence during a high-speed imaging period in a case wherein transverse magnetization in only the phase encoding gradient field direction is refocused;

DETAILED DESCRIPTION OF THE PREFERRED EMBODIMENTS

A preferred embodiment of a magnetic resonance imaging apparatus according to the present invention will now be described with reference to the accompanying drawings.

Figure 1:
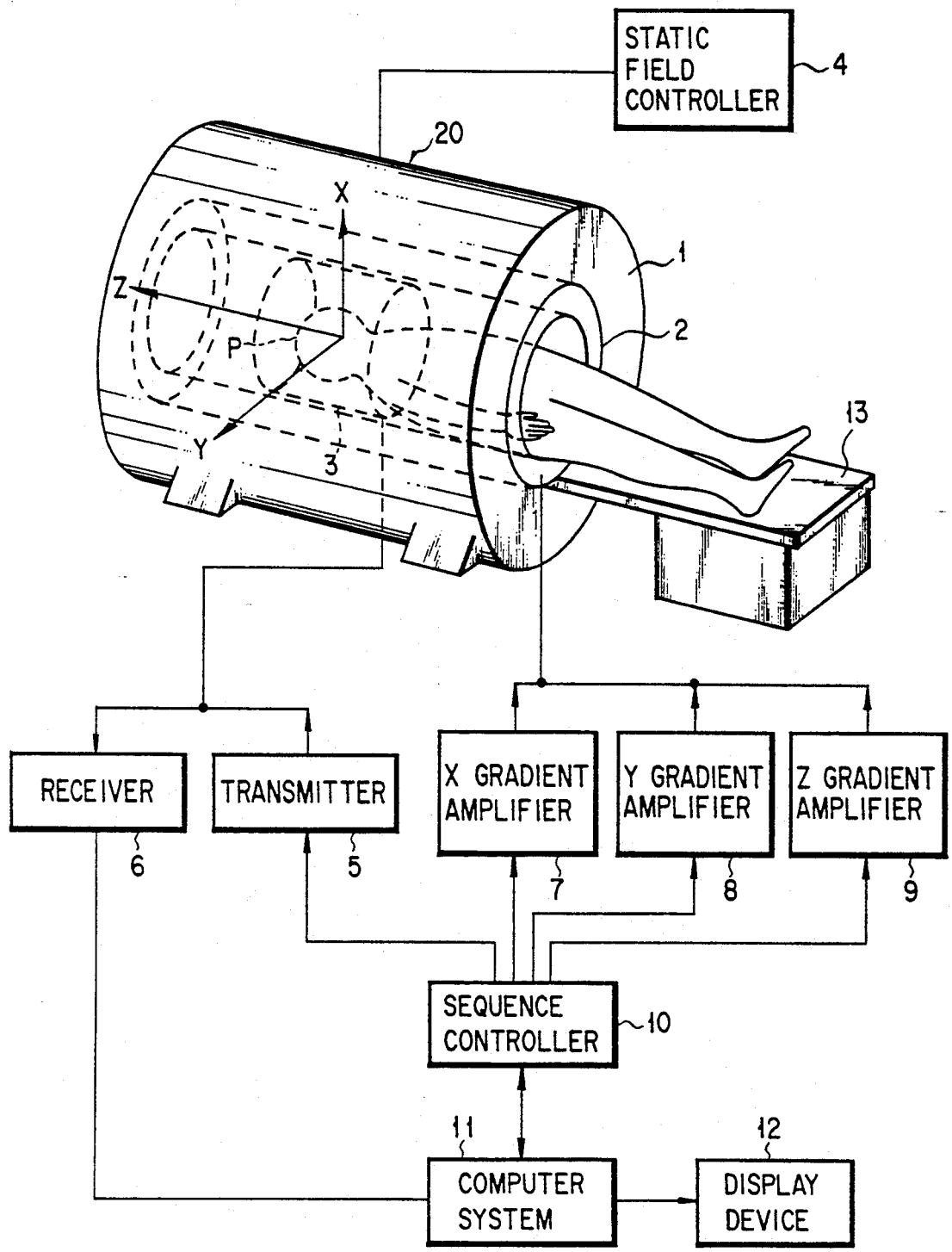
FIG. 1 is a block diagram showing the arrangement of a magnetic resonance imaging apparatus according to a first embodiment of the present invention.

Referring to FIG. 1, there is illustrated a magnetic resonance imaging apparatus of the present invention in block form. A static magnetic field forming magnet 1, an x-axis, y-axis, and z-axis gradient magnetic fields forming coil system 2, and a transmitter/receiver coil system 3 are installed in a gantry 20. The transmitter/receiver coil 3 may be directly attached to a human body P under examination instead of being embedded in the gantry.

The magnet 1, serving as a means of forming a static magnetic field, can be constructed of a superconducting or normal-conducting coil. The x-axis, y-axis, and z-axis gradient fields forming coil system 2 is adapted to generate an x-axis gradient field Gx, a y-axis gradient field Gy, and a z-axis gradient field Gz. The transmitter/receiver coil 3 emits a radio-frequency (RF) pulse for tilting a spin by a predetermined flip angle and detects a magnetic resonance signal (echo signal) generated by magnetic resonance induced in the selected slice. The human body P, laid down an examination couch 13, is allowed to have access to the imaging space within the gantry 20. The imaging space is a spherical space in which imaging magnetic fields are formed, and imaging diagnosis can be made only when an imaging portion of the human body lies within this space.

The static magnetic field forming magnet 1 is driven by a static field controller 4. The transmitter/receiver coil 3 is coupled to a transmitter 5 at the time of inducing magnetic resonance in the human body and to a receiver 6 at the time of detecting magnetic resonance signals from the human body. The x-axis, y-axis, and z-axis gradient fields forming coil system 2 is driven by x-axis, y-axis, and z-axis gradient field power supplies (amplifiers) 7, 8, and 9.

The x-axis, y-axis, and z-axis gradient field amplifiers 7, 8, and 9, and the transmitter 5 are driven by a sequence controller 10, thereby generating an x-axis gradient field Gx, a y-axis gradient field Gy, a z-axis gradient field Gz, and a radio-frequency (RF) pulse in accordance with a predetermined pulse sequence which will be described later. In this case, the gradient fields Gx, Gy, and Gz are used as a phase-encoding gradient field Ge, a readout (or frequency-encoding) gradient field Gr, and a slice-selective gradient field Gs, respectively. A computer system 11 drives and controls the sequence controller 10 and receives magnetic resonance signals from the receiver 6 for signal processing, thereby reconstructing a cross-sectional magnetic resonance (MR) image of the human body and displaying it on a display device 12.

Figure 2:
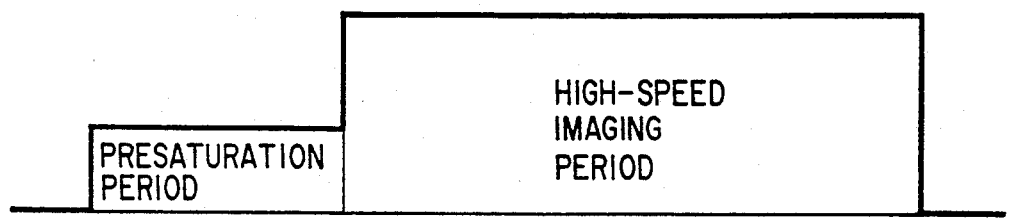
FIG. 2 shows a general operation of the first embodiment.

An operation of the first embodiment will be described below. As indicated by the pulse sequence in FIG. 2, one imaging operation includes a presaturation period for determining a slice, and a subsequent high-speed imaging period for acquiring a one-slice MR signal.

Figure 3:
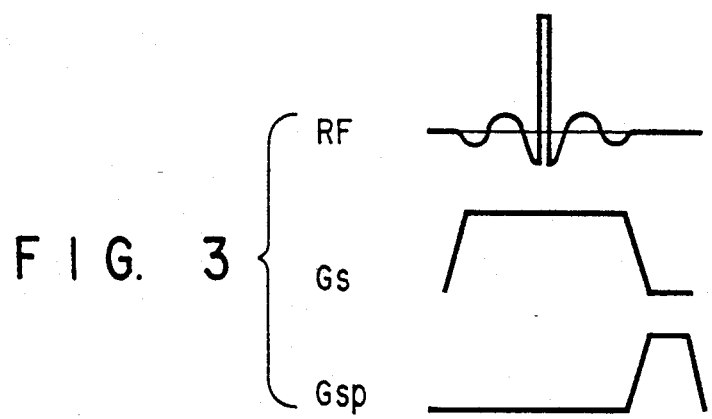
FIG. 3 shows a pulse sequence during a presaturation period in the first embodiment.

As shown in FIG. 3, the presaturation period includes a period during which a selective gradient field Gs for determining a slice is applied, and at the same time a short rectangular non-selective excitation RF pulse for tilting the overall spins of an object (to be detected) by 90°, and a Gaussian selective excitation RF pulse for tilting only the spins within an imaging region by −90° are simultaneously applied, and a subsequent period in which a spoiler gradient field Gsp is applied to saturate the spins outside the imaging region by spoiling transverse magnetization produced upon the application of the RF pulse. In this case, the thickness of the slice are determined by the waveform of the selective excitation pulse, and the position of the slice is determined by the amplitude of the slicing gradient field Gs and the frequency of the RF pulse.

In this case, the RF pulse has a modulation waveform defined by $A \times \text{sinc}Bt \times \cos Ct$, where A, B, and C are constants, and t is a time. The constant A determines flip angle of a spin; and the constants B and C, a saturation region. The position of a slice is determined by the amplitude of the slicing gradient field Gs and the frequency of the RF pulse. The flip angle of the RF pulse is preferably set to be slightly larger than 90° in order to reduce the mixing of unnecessary signals upon longitudinal magnetization recovery in the imaging region.

Spins outside the imaging region are selectively saturated by such presaturation, and no signals are generated from the portions outside the imaging region. For this reason, in the high-speed imaging, an MR signal is generated from only the imaging region without selectively exciting only the imaging region.

Figure 4:
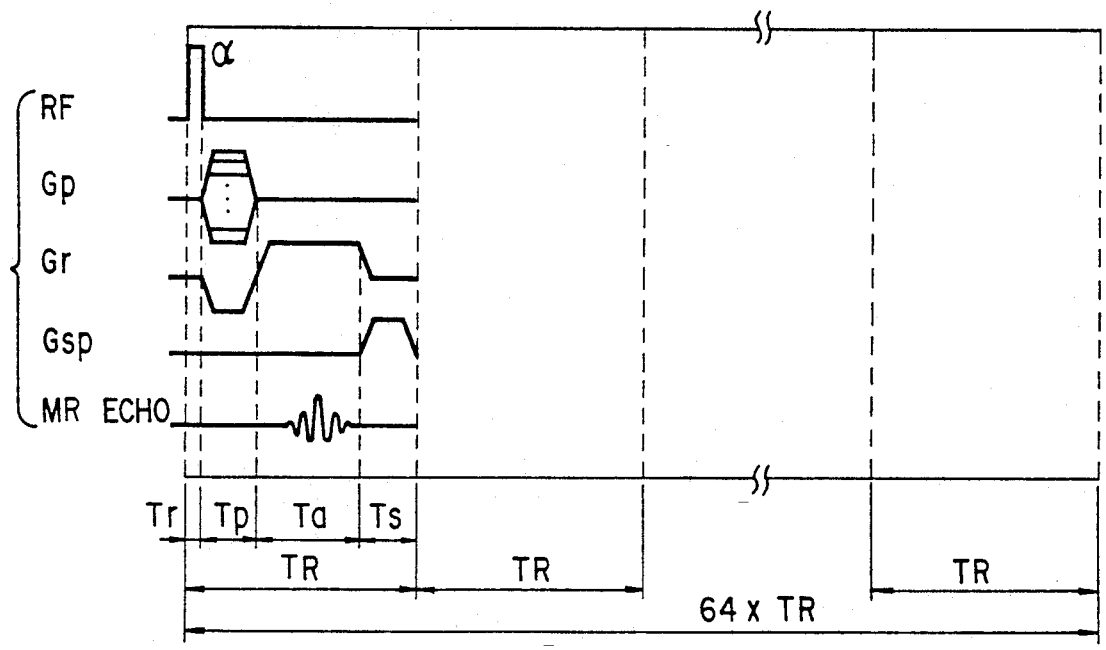
FIG. 4 shows a pulse sequence during a high-speed imaging period in the first embodiment.

As shown in FIG. 4, in the high-speed imaging period, an interval TR is repeated a large number of times, 64 in this case, while the amplitude of a phase-encoding gradient field Gp is changed. The interval TR is constituted by the following steps of: applying a very short rectangular radio frequency pulse RF (non-selective excitation pulse) for tilting the spins in a slice by a predetermined flip angle a (preferably set to be small, generally 5° or less); applying the phase encoding gradient field Gp and a readout gradient field Gr to extract the signals based on the spins in the slice; inverting the readout gradient field Gr to generate an MR signal; and applying a spoiler gradient field Gsp for spoiling transverse magnetization produced outside the imaging region upon application of the RF pulse. The spoiler gradient Gsp is generally applied in the readout direction. However, it is possible to apply the spoiler gradient Gsp in the slicing direction. In this case, a slice selective gradient field need not be applied.

If an application time Tr of the RF pulse is 0.1 ms; an application time Tp of the phase encoding gradient field Gp, 0.3 ms; an MR signal acquisition time Ta, 1.6 ms; and an application time Ts of the spoiler gradient field Gsp, 0.3 ms, the repetition time TR becomes 2.3 ms. In the above case, since the number of phase encoding steps is 64, the high-speed imaging period is about 150 ms. Although the spin-lattice relaxation time T1 of the fat, which has the shortest spin-lattice relaxation time, is about 150 ms, the spin-lattice relaxation time T1 of the brain parenchyma is about 300 to 500 ms, and the time T1 of the cerebrospinal fluid is 1,500 ms or more. That is, it is possible to shorten the high-speed imaging period according to the present invention than the spin-lattice relaxation time T1.

As described above, in the first embodiment, spins outside an imaging region are selectively saturated during a presaturation period prior to an imaging period (a data acquisition period, and imaging is completed in a period of time equal to or shorter than the spin-lattice relaxation time T1 of a tissue. There is no need to perform selective excitation every time an MR signal is acquired while changing the amplitude of the phase encoding gradient, as in the prior art. For this reason, a rectangular non-selective excitation RF pulse can be used in an imaging period in each encoding step during a high-speed imaging, and a Gaussian selective RF pulse and a slice selective gradient field, both used for selective excitation, need not be applied for each data acquisition, thus reducing the load to each gradient amplifier. Since a very short rectangular pulse can be used as a non-selective excitation pulse RF, the application time of the RF pulse can be shortened to about 1/10 that of the prior art.

In addition, if the number of phase-encoding steps is 64, the repetition time TR in the conventional snapshot FLASH method is 3 ms, and the time TR in the present invention is 2.3 ms. That is, the high-speed imaging period during which the repetition time TR is repeated 64 times can be shorted by about 50 ms ($\approx$0.7 ms$\times$64). Note that the presaturation period is 2 ms to 5 ms.

Moreover, the present embodiment can also improve the quality of an image by preventing a decrease in resolution and S/N ratio due to the accumulation of slice profile imperfections caused by selective excitation gradient fields for the respective operations and the accumulation of imperfections in correction (rephasing) of phase shifts caused by the selective excitation gradient fields. In addition, the time interval between excitation and signal acquisition is shortened, and no slice selective excitation gradient field is required. Therefore, phase dispersion caused by gradient fields applied to a blood flow can be prevented, and blood flow artifacts can be reduced.

As described above, according to the first embodiment, a slice selective gradient field need not be caused to rise or fall within a short period of time so that the load to a gradient amplifier can be reduced, and a reduction in noise can be achieved. In addition, phase shifts of spins and instability of slice profiles in the slicing direction can be prevented to improve the image quality. A non-selective excitation pulse is shorter than a selective excitation pulse to shorten the imaging time. Re-phasing for removing flow or movement artifacts need not be performed in the slicing direction, so that the embodiment is effective for MR angiography. Moreover, non-fresh spins saturated by presaturation flow into a slice, and no inflow effect is produced accordingly.

Modifications of the first embodiment will be described next.

A modification of the RF pulse for selectively saturating spins outside an imaging region during a presaturation period will be described as the first modification. Referring to FIG. 3, the short rectangular RF pulse for tilting the overall spins by 90° and the selective excitation RF pulse for tilting only the spins within the imaging region by −90° are applied at the same time. However, these pulses may be sequentially applied as follows.

1) As shown in FIG. 5, the short rectangular RF pulse for tilting the overall spins by 90° may be applied while the slicing gradient field Gs is applied. The selective excitation RF pulse for tilting only the spins within the imaging region by −90° may be then applied. Note that the slicing gradient field Gs may be applied after the rectangular pulse is applied.

2) As shown in FIG. 6, the selective excitation pulse for tilting only the spins in the imaging region by 90° may be applied while the slicing gradient field Gs is applied. The short rectangular pulse for tilting the overall spins by −90° may be then applied. Note that the rectangular pulse may be applied after the slicing gradient field Gs is applied.

As a second modification, an example of the gradient field for refocusing transverse magnetization after a signal read operation will be described in detail below.

1) When refocusing is to be performed in only the phase encoding gradient field Gp direction, the pulse sequence shown in FIG. 7 is executed during a high-speed imaging period.

Figure 8:
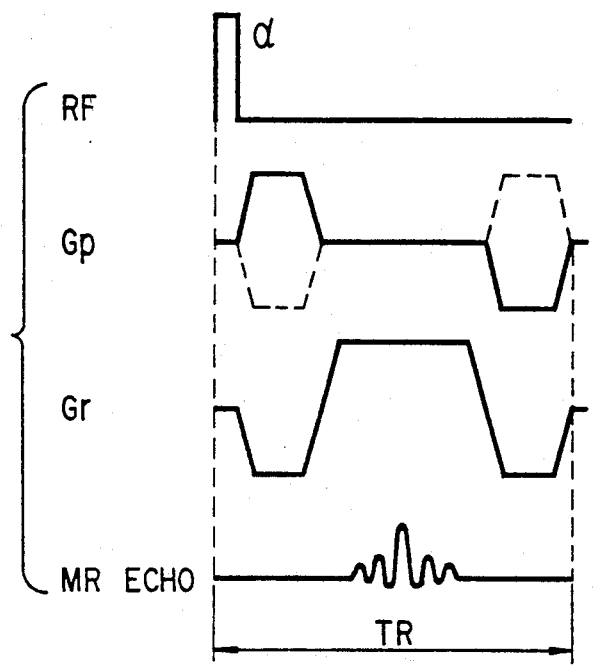
FIG. 8 shows a pulse sequence during a high-speed imaging period in a case wherein transverse magnetization in both the phase encoding gradient field direction and the readout direction is refocused.

2) When refocusing is to be performed in both the phase encoding gradient field Gp direction and the readout gradient field Gr direction, the pulse sequence shown in FIG. 8 is executed during a high-speed imaging period.

Figure 9:
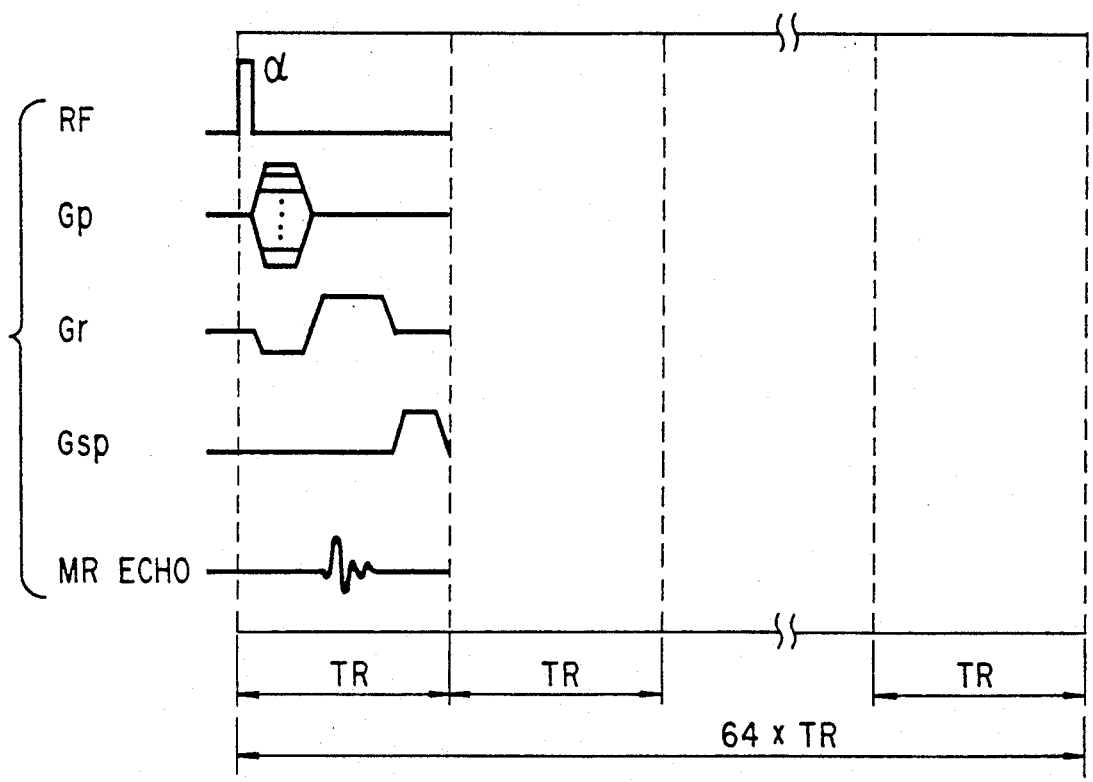
FIG. 9 shows a pulse sequence during a high-speed imaging period in a case wherein a repetition time TR is shortened by asymmetrical measurement of a signal.

As a third modification, an example of how to further shorten the repetition time TR by asymmetrical measurement of a signal will be described below. FIG. 9 shows a pulse sequence during a high-speed imaging period in the third modification. The readout gradient field Gr is modified to substantially advance the timing in order to advance the timing at which an echo is generated, thereby shortening the echo time. With this operation, not more than the range of 20 to 30% of an MR signal components acquired after the center of the echo is acquired before the center of the echo. That is, signal acquisition in the readout direction is asymmetrically performed with respect to the center of an echo. In a known method (e.g., the half Fourier method), not all the MR data is acquired, but the waveform of the portion which is not acquired is estimated from the obtained data by data processing. If the third modification is combined with this method, the processing time can be further shortened.

As a fourth embodiment, a method of increasing the resolution in a slice will be described below.

Figure 10:
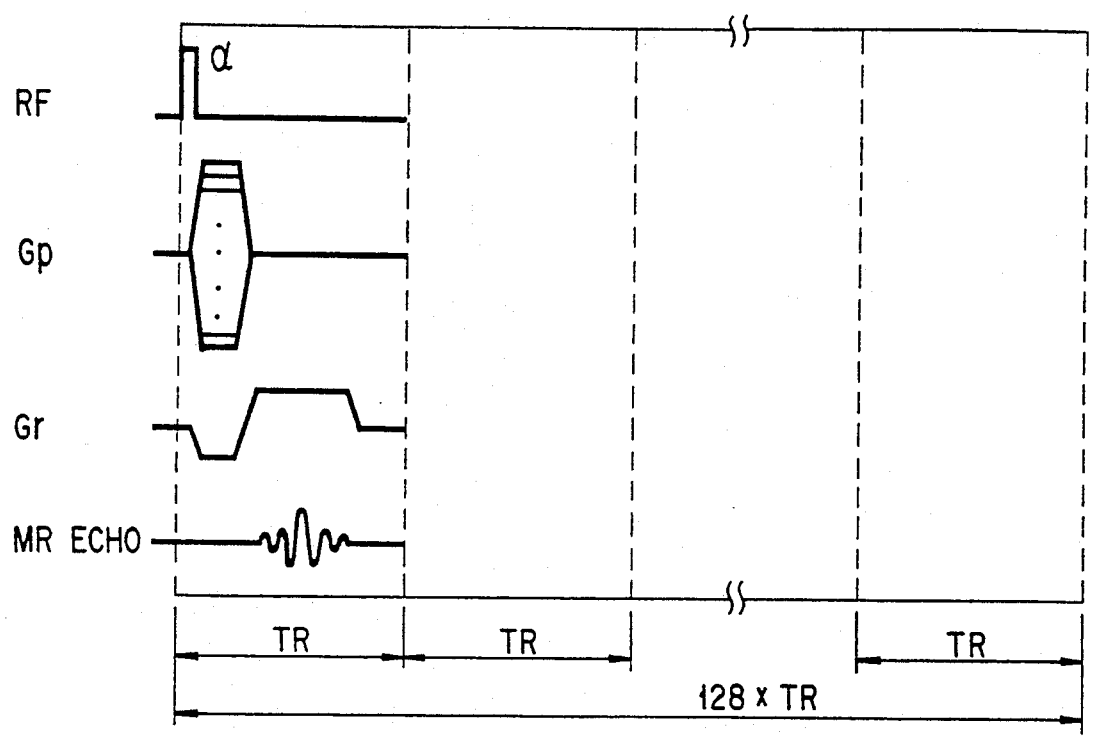
FIG. 10 shows a pulse sequence during a high-speed imaging period in a case wherein the resolution within a slice is increased by increasing the number of phase encoding steps.

1) The number of phase encoding steps may be simply increased. FIG. 10 shows a case wherein the number of steps is increased from, e.g., 64 to 128. Note that the spoiler gradient field is omitted in FIG. 10.

Figure 11:
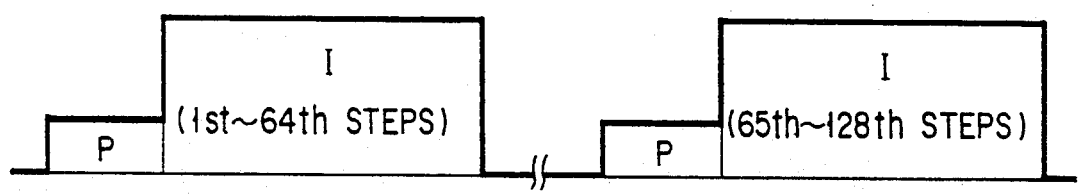
FIG. 11 is a view showing a pulse sequence during a high-speed imaging period in a case wherein imaging period is divided into two periods when the resolution within a slice is increased by increasing the number of phase encoding steps.

2) If the number of encoding steps is simply increased, although the resolution is increased, the imaging time is prolonged. The longitudinal magnetization outside the imaging region may be recovered to cause mixing of unnecessary signals. For this reason, when the number of encoding steps is set to be 128, one imaging operation is divided into two operations, i.e., first to 64th encoding steps in a first high-speed imaging period I; and 65th to 128th steps in a second high-speed imaging period I, as shown in FIG. 11. Note that the division number of high-speed imaging periods is not limited to two but may be three or more.

Figure 12:
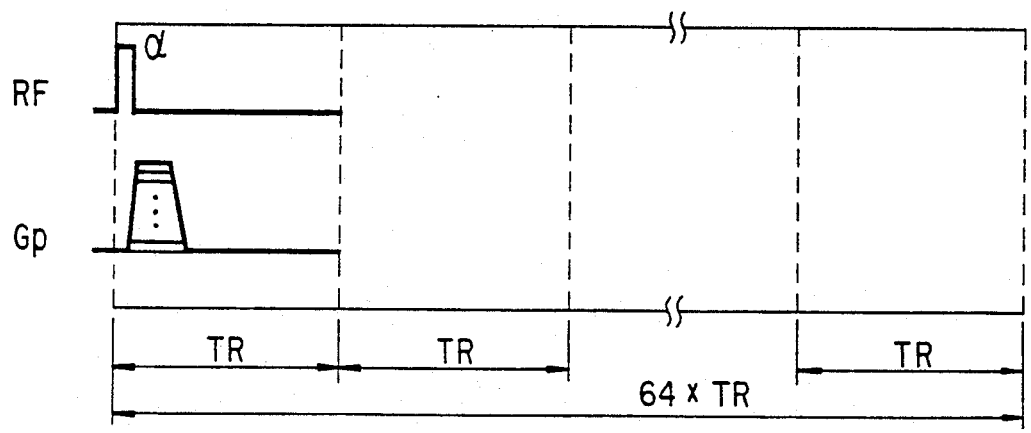
FIG. 12 shows a pulse sequence during a high-speed imaging period in a case wherein the resolution within a slice is increased by a half Fourier method.

3) If the number of encoding steps is set to be 128, the known half Fourier imaging method shown in FIG. 12 may be used to estimate signals corresponding to 128 steps from a small number of measurements (64 encoding steps in this case) on the basis of the same principle as that of asymmetrical measurement. Note that a readout gradient field and a spoiler gradient field are not shown in FIG. 12.

A second embodiment of the present invention will be described below. Since the arrangement of an apparatus of the second embodiment is the same as that of the first embodiment, a description thereof will be omitted.

In the second embodiment, a contrast enhancement pulse which reflects the differences in T1, T2, and chemical shift between tissues in accordance with the amplitude of longitudinal magnetization, and a spoiler gradient field for spoiling transverse magnetization as needed are applied before a presaturation period to obtain a T1 enhancement (T1 contrast), T2 enhancement (T2 contrast), or chemical shift image.

Figure 13A:
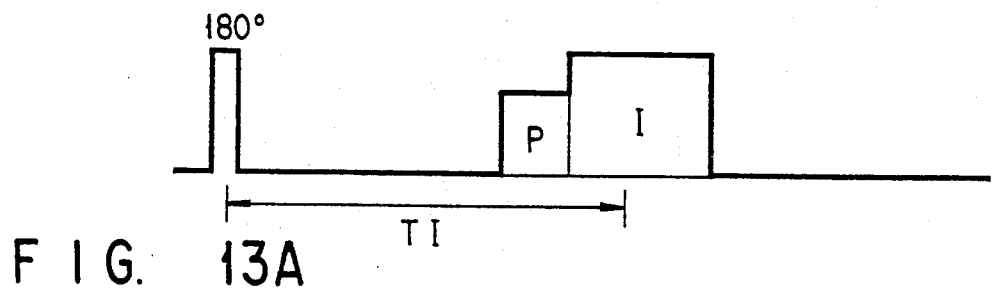
FIGS. 13A and 13B show a pulse sequence for T1 enhancement imaging in a magnetic resonance imaging apparatus according to a second embodiment of the present invention.

In the T1 enhancement imaging mode, as shown in FIG. 13A, the pulse sequence in the first embodiment is performed immediately or a given period of time after a 180° pulse is applied. Though not shown, a spoiler gradient field may be applied within this period. After presaturation (P) period, the spins outside the slice are saturated and hence do not contribute to the generation of MR signals. The spins in the slice are recovered to equilibrium magnetization to different degrees because of their different spin-lattice relaxation times T1. An image obtained by the subsequent high-speed imaging (I) period depends on the spin-lattice relaxation time. As a result, the image becomes a T1 enhancement image. That is, the degree of T1 enhancement depends on a time TI between the 180° pulse and imaging period (the center of the MR signal obtained when the phase encoding gradient field is 0).

Figure 13B:
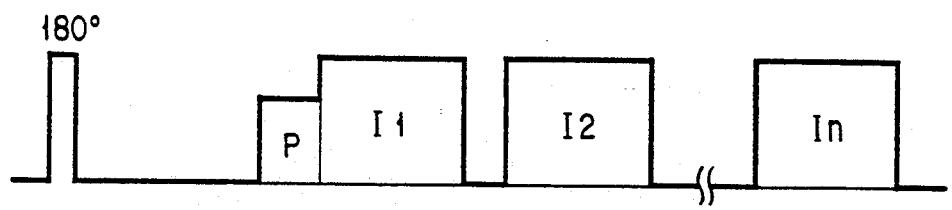

As long as mixing of unnecessary signals from the outside of a slice does not interfere with imaging processing, images having different T1 enhancement degrees can be obtained by repeating similar high-speed imaging sequences I1 to In, as shown in FIG. 13B, and it is possible to obtain T1 value from various types of inter-image processing. Note that the respective high-speed imaging sequences I1 to In may be continuously executed.

Figure 14:
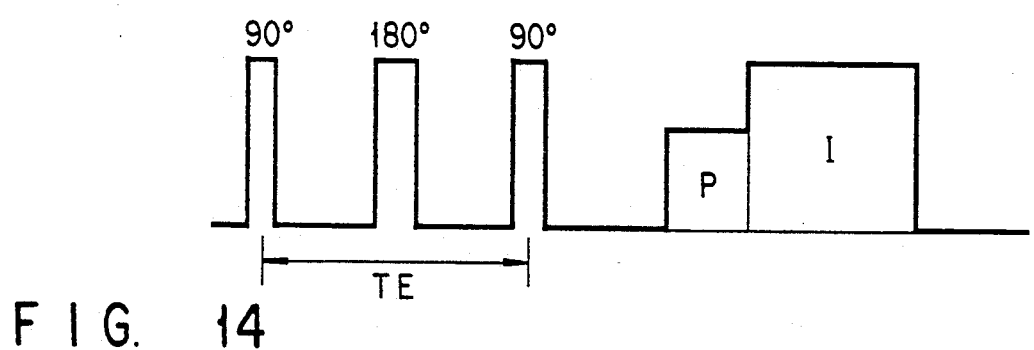
FIG. 14 shows a pulse sequence for T2 enhancement imaging in the second embodiment.

In the T2 enhancement imaging mode, as shown in FIG. 14, the pulse sequence in the first embodiment is executed after 90°-180°-90° pulses are applied. After presaturation period (P), longitudinal magnetization is attenuated by spin-spin relaxation within a time interval TE between the two 90° pulses. For this reason, a T2 enhancement image is obtained by the subsequent high-speed imaging sequence (I). The T2 enhancement degree depends on the time interval TE between the two 90° pulses.

Figure 15:
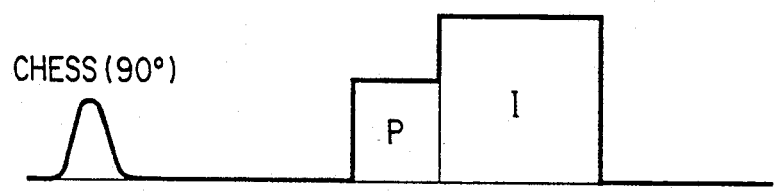
FIG. 15 shows a pulse sequence for chemical-shift-selective imaging in the second embodiment.

In the chemical shift imaging mode, as shown in FIG. 15, a magnetic unit for generating a strong, uniform field, and a 90° pulse (Chemical-Shift-Selective: CHESS) is applied to selectively excite either the water or the fat by using the difference in chemical shift therebetween. For example, after the fat is saturated, the pulse sequence in the first embodiment is performed. In this case, after presaturation sequence (P), the spins outside the slice are saturated and hence do not contribute to the generation of MR signals, and only the water in the slice has transverse magnetization. As a result, a water image is obtained by the subsequent imaging sequence (I). In contrast to this, assume that the pulse sequence in the first embodiment is performed after the water is saturated. In this case, the spins outside the slice are saturated and hence do not contribute to the generation of MR signals, and only the fat in the slice has transverse magnetization. For this reason, a fat image is obtained by the subsequent imaging sequence (I).

Figure 16:
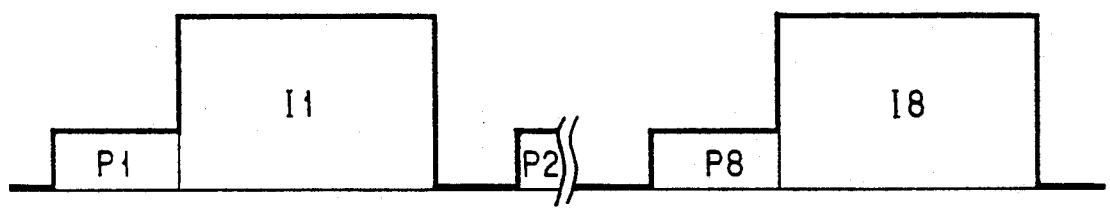
FIG. 16 shows a pulse sequence for three-dimensional imaging in a magnetic resonance imaging apparatus according to a third embodiment of the present invention.

A third embodiment in which the present invention is applied to three-dimensional imaging will be described next. In this case, the number of phase encoding steps is greatly increased. For this reason, as shown in FIG. 16, the slice thickness is increased, and the one imaging operation is divided into several operations such a manner that presaturation and high-speed imaging are performed once every time the amplitude of the slice encoding gradient field Gs is changed. In this case, provided that a presaturation period, a high-speed imaging period, and a recovery period constitute one cycle, eight cycles are executed while the amplitude of the slice encoding gradient field Gs is changed.

Figure 17:
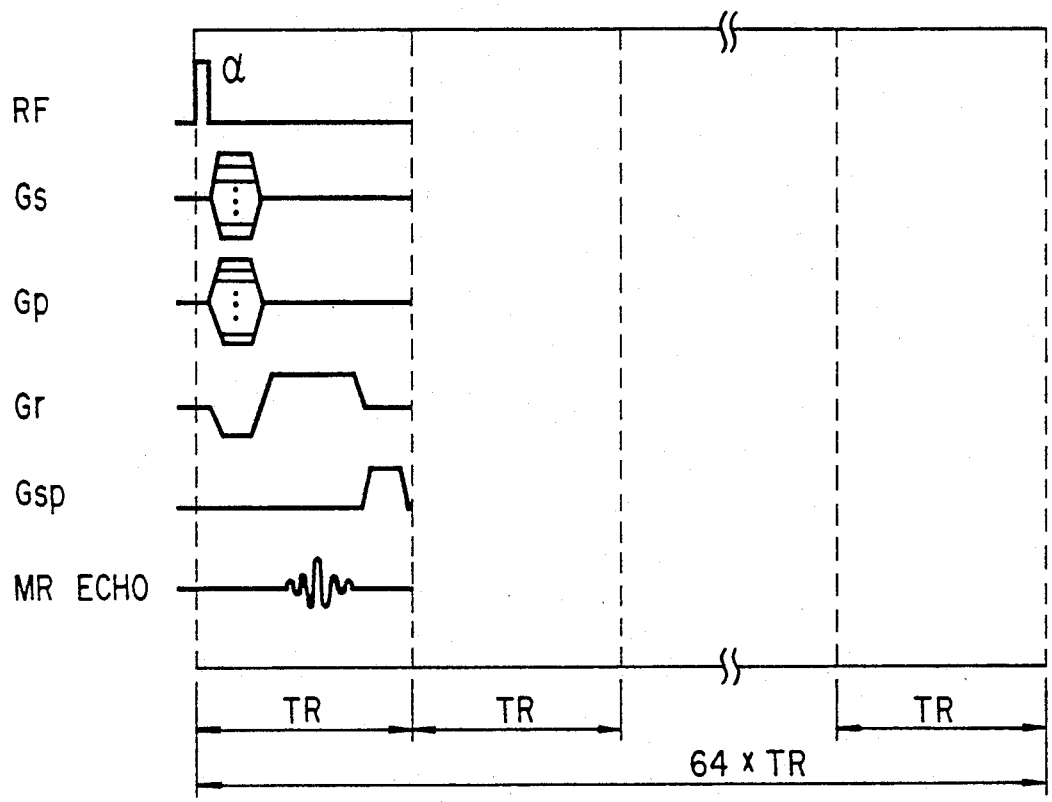
FIG. 17 shows a pulse sequence during a high-speed imaging period in the third embodiment.

FIG. 17 shows a pulse sequence in one high-speed imaging period. In one high-speed imaging operation, data acquisition is performed 64 times while the amplitude of the phase encoding gradient field Gp is changed and the amplitude of the slice selective gradient field Gs is set to a given value. The same operation is repeated while the amplitude of the slice selective gradient field Gs is changed 8 times. Note that an electrocardiogram or a respiratory sync. signal may be used to prevent motion artifacts or perform cine MRI.

As has been described above, according to the present invention, presaturation for selectively saturating spins outside an imaging region is performed before a high-speed imaging operation so as to complete the imaging operation in a period of time equal to or shorter than the spin-lattice relaxation time T1 of an tissue. Selective excitation need not be performed by changing the amplitude of the phase encoding gradient every time an MR signal is acquired. In the high-speed imaging period, a short rectangular non-selective excitation RF pulse may be applied. Therefore, the repetition time TR can be shortened regardless of the specifications of each gradient amplifier.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although the field echo method is exemplified as a method of acquiring an MR signal, other acquisition methods may be used. In addition, other pulse sequences in a presaturation period than those described above may be used as long as they can selectively excite spins outside an imaging region.

What is claimed is:

1. A magnetic resonance imaging apparatus comprising:
saturation means for selectively saturating spins outside an imaging region; and
high-speed imaging means for acquiring a magnetic resonance signal in the imaging region by using a nonselective excitation pulse while the spins outside the imaging region are saturated, said high-speed imaging means executing a pulse sequence in which an operation (1) of applying a non-selective excitation pulse, an operation (2) of applying a phase encoding gradient field, and an operation (3)

of generating a magnetic resonance signal by inverting a readout gradient field are repeated while an amplitude of the phase encoding gradient field is changed.

2. An apparatus according to claim 1, wherein said saturation means comprises:
means for applying a slice selective gradient field for selecting an imaging region; and
means for simultaneously applying a rectangular radio-frequency pulse for tilting overall spins of an object by 90° and a Gaussian radio-frequency pulse for selectively tilting only spins in the imaging region by −90°, together with the slice selective gradient field.

3. An apparatus according to claim 1, wherein said saturation means comprises:
means for applying a slice selective gradient field for selecting an imaging region; and
means for sequentially applying a rectangular radio-frequency pulse for tilting overall spins of an object by 90° and a Gaussian radio-frequency pulse for selectively tilting only spins in the imaging region by −90°, together with the slice selective gradient field.

4. An apparatus according to claim 1, wherein said saturation means comprises:
means for applying a slice selective gradient field for selecting an imaging region; and
means for sequentially applying a Gaussian radio-frequency pulse for selectively tilting only spins in the imaging region by 90° and a rectangular radio-frequency pulse for tilting overall spins of an object by −90°, together with the slice selective gradient field.

5. An apparatus according to claim 1, wherein saturation means comprises means for applying a gradient field for spoiling transverse magnetization outside the imaging region after the spins outside the imaging regions are selectively saturated.

6. An apparatus according to claim 1, wherein said saturation means comprises means for generating an radio-frequency pulse having a modulation waveform represented by $A \times sincBt \times cosCt$ where A, B, and C are constants, and t is a time.

7. An apparatus according to claim 1, wherein said high-speed imaging means comprises:
means for supplying a rectangular radio-frequency pulse for tilting spins by a predetermined angle; and
means for simultaneously applying a phase encoding gradient field and a readout gradient field, and subsequently inverting the readout gradient field.

8. An apparatus according to claim 7, wherein said high-speed imaging means comprises:
means for inverting the readout gradient field at such a timing that acquisition of a magnetic resonance signal in a readout direction is performed asymmetrically with respect to a center of the magnetic resonance signal so that some signal components before the center of the magnetic resonance signal are not acquired; and
means for estimating said some signal components which are not acquired by a half Fourier method.

9. An apparatus according to claim 1, wherein said high-speed imaging means comprises means for applying a gradient field for refocusing transverse magnetization in the imaging region in a phase encoding direction after a magnetic resonance signal is acquired.

10. An apparatus according to claim 1, wherein said high-speed imaging means comprises means for applying a gradient field for refocusing transverse magnetization in the imaging region in a phase encoding direction and a readout direction after a magnetic resonance signal is acquired.

11. An apparatus according to claim 1, wherein said high-speed imaging means executes a pulse sequence in such a manner that the operations (1) to (3) are repeated while an amplitude of the phase encoding gradient field is changed with respect to some of all phase encoding steps, and the operations (1) to (3) are subsequently repeated after said saturation means is operation while the amplitude of the phase encoding gradient field is changed with respect to remaining some of the phase encoding steps.

12. An apparatus according to claim 1, wherein said high-speed imaging means comprises:
means for executing a pulse sequence in which the operations (1) to (3) are repeated while an amplitude of the phase encoding gradient field is changed with respect to a half of all phase encoding steps; and
means for estimating some signal components, which are not acquired, by a half Fourier method.

13. An apparatus according to claim 1, further comprising means for operating said saturation means after applying a 180° pulse.

14. An apparatus according to claim 13, further comprising means for operating said high-speed imaging means a plurality of times after said saturation means is operated.

15. An apparatus according to claim 1, further comprising means for operating said saturation means after applying 90°-180°-90° pulses.

16. An apparatus according to claim 1, further comprising means for operating said saturation means after applying a chemical-shift-selective 90° pulse for selectively exciting one of water and fat.

17. An apparatus according to claim 1, wherein said high-speed imaging means comprises means for applying a rectangular radio-frequency pulse for tilting spins by a small angle of not more than 5°.

* * * * *